(12) United States Patent
Jung et al.

(10) Patent No.: US 9,423,439 B2
(45) Date of Patent: Aug. 23, 2016

(54) APPARATUS AND METHOD FOR DETECTING FOREIGN OBJECT IN WIRELESS POWER TRANSMITTING SYSTEM

(71) Applicant: HANRIM POSTECH CO., LTD., Suwon-si, Gyeonggi-do (KR)

(72) Inventors: Chun Kil Jung, Seoul (KR); Byong Uk Hwang, Incheon (KR)

(73) Assignee: HANRIM POSTECH CO., LTD., Gyeonggi-Do (KR)

( * ) Notice: Subject to any disclaimer, the term of this patent is extended or adjusted under 35 U.S.C. 154(b) by 294 days.

(21) Appl. No.: 14/213,923

(22) Filed: Mar. 14, 2014

(65) Prior Publication Data

US 2014/0266036 A1    Sep. 18, 2014

(30) Foreign Application Priority Data

Mar. 15, 2013  (KR) ........................ 10-2013-0028169

(51) Int. Cl.
| | | |
|---|---|---|
| *G01R 29/08* | (2006.01) | |
| *H02J 7/02* | (2016.01) | |
| *B60L 11/18* | (2006.01) | |
| *H02J 5/00* | (2016.01) | |

(Continued)

(52) U.S. Cl.
CPC ............ *G01R 29/0814* (2013.01); *B60L 3/04* (2013.01); *B60L 11/182* (2013.01); *B60L 11/1824* (2013.01); *B60L 11/1838* (2013.01); *H02J 5/005* (2013.01); *H02J 7/025* (2013.01); *H04B 5/0037* (2013.01); *B60L 2240/662* (2013.01); *H04B 5/0081* (2013.01); *Y02T 10/7005* (2013.01); *Y02T 10/7072* (2013.01); *Y02T 10/7291* (2013.01); *Y02T 90/121* (2013.01); *Y02T 90/122* (2013.01); *Y02T 90/128* (2013.01); *Y02T 90/14* (2013.01); *Y02T 90/16* (2013.01); *Y02T 90/163* (2013.01)

(58) Field of Classification Search
CPC .................................................. G01R 29/0814
USPC ......................................................... 320/108
See application file for complete search history.

(56) References Cited

U.S. PATENT DOCUMENTS

| | | | |
|---|---|---|---|
| 2010/0026236 A1 | 2/2010 | Kamiyama et al. | 320/108 |
| 2010/0308939 A1 | 12/2010 | Kurs | 333/219.2 |
| 2012/0038317 A1 | 2/2012 | Miyamoto et al. | 320/108 |

(Continued)

FOREIGN PATENT DOCUMENTS

| | | |
|---|---|---|
| CN | 1954472 A | 4/2007 |
| CN | 102548789 A | 7/2012 |

(Continued)

OTHER PUBLICATIONS

Chinese Office Action dated Sep. 6, 2015, issued to Chinese Application No. 201410079114.X.

(Continued)

*Primary Examiner* — Thuan Do
(74) *Attorney, Agent, or Firm* — Stein IP, LLC

(57) ABSTRACT

An apparatus and method for detecting a foreign object in a wireless power transmitting system are provided. In a case in which a foreign object is not detected prior to charging, an attempt to detect a foreign object detection during charging is performed, and when a foreign object is not detected while a power signal is being received, power is limited based on a temperature sensor.

13 Claims, 10 Drawing Sheets

(51) Int. Cl.
*H04B 5/00* (2006.01)
*B60L 3/04* (2006.01)

(56) References Cited

U.S. PATENT DOCUMENTS

| | | |
|---|---|---|
| 2012/0326524 A1 | 12/2012 | Matsumoto et al. .......... 307/104 |
| 2014/0015522 A1* | 1/2014 | Widmer ............... G01D 5/2006 |
| | | 324/239 |

FOREIGN PATENT DOCUMENTS

| | | |
|---|---|---|
| CN | 102694423 A | 9/2012 |
| CN | 102782983 A | 11/2012 |
| DE | 10 2009 033 2 | 1/2011 |
| EP | 2 503 663 A1 | 9/2012 |
| EP | 2 555 379 A1 | 2/2013 |
| JP | 2007-537688 A | 12/2007 |
| JP | 2008-206231 A | 9/2008 |
| JP | 2010-220418 A | 9/2010 |
| JP | 2011-211760 A | 10/2011 |
| JP | 2012-257404 A | 12/2012 |
| WO | WO 2005/109597 A1 | 11/2005 |

OTHER PUBLICATIONS

Japanese Office Action issued on Jan. 6, 2015 for the corresponding JP Application No. 2014-043415.
European Examination report dated Jan. 20, 2016, issued to corresponding application 14 159 927.4-1804.
Choi W P. et al: "Bidirectional communication techniques for wireless battery charging systems & portable consumer electronics", Applied Power Electronics Conference and Exposition (APEC), 2010 TWENTY0FIFTH Annual IEEE, IEEE, Piscataway, NJ, USA, Feb. 21, 2010, pp. 2251-2257, XP031649750, ISBN: 978-1-4244-4782-4.
European Search Report issued by the European Patent Office on Sep. 4, 2014 for the corresponding EP Application No. 14159927.4.

* cited by examiner

APPARATUS AND METHOD FOR DETECTING FOREIGN OBJECT IN WIRELESS POWER TRANSMITTING SYSTEM

CROSS-REFERENCE TO RELATED APPLICATIONS

This application claims the benefit of priority of Korean Application No. 10-2013-0028169, filed on Mar. 15, 2013 in the Korean Intellectual Property Office, the contents of which are incorporated by reference in their entirety herein.

BACKGROUND OF THE INVENTION

1. Field of the Invention

The present invention is related to wireless power transmission; more particularly, to an apparatus and method for detecting a foreign object in a wireless power transmitting system.

2. Description of the Related Art

In general, an external charger is used to charge portable terminals such as a mobile phone, notebook computer, or PDA by supplying electric energy or electric power thereto. Conventional portable terminals include battery cells storing supplied electric energy and a circuit intended for charging and discharging the battery cells, thereby providing electric energy to the portable terminals.

The electrical interface between the charger and the battery cells, through which battery cells are charged with electric energy, may take the form of contacts. A contact-type electrical interface receives commercial electricity, transforms the electricity into voltage and currents relevant to the battery cells, and provides electric energy to the battery cells through the contacts of the corresponding battery cells.

Contacts of this kind require physical cables or use of electrical wires. Therefore, when a large number of terminals requiring the contact-type electric interface for energy are used, a large number of cables tend to occupy considerable workspace and may be unsightly or disorganized because it is not easy to arrange the cables properly. Moreover, the contact-type electrical interface may cause problems such as instant discharge due to a potential difference between contacts, abrasion and risk of fire due to presence of flammable foreign objects, spontaneous discharge, decrease of battery lifetime, and degradation of battery performance.

Recently, to solve the aforementioned problems, charging systems employing wireless power transmission (hereinafter, referred to as wireless power transmitting systems) and control methods for such systems have begun development. A wireless power transmitting method is also called a contactless power transmitting method or no point-of-contact power transmitting method. A wireless power transmitting system comprises a wireless power transmitting apparatus, which provides electric energy through wireless power transmission, and a wireless power receiving apparatus, which receives electric energy provided wirelessly from the wireless power transmitting apparatus and charges battery cells with the received electric energy.

Once connections are well secured between a charger and a mobile terminal, the contact-type electrical interface suffers little from obstacles disturbing battery charge, such as foreign objects. In contrast, because of the inherent characteristics of a wireless power transmitting system utilizing no-point-of-contact charge, there is a high chance that foreign objects could be inserted between the wireless power receiving apparatus and wireless power transmitting apparatus during charging. If a foreign object such as a metallic part is present between the wireless power receiving apparatus and wireless power transmitting apparatus, smooth power transmission is impaired due to the foreign object. Furthermore, problems such as damage and even detonation of the corresponding product due to overload and heating of the foreign object may result. Therefore, there is a need for an apparatus and method which detects foreign objects in a wireless power transmitting system.

SUMMARY OF THE INVENTION

An object of the present invention is to provide an apparatus and method for detecting a foreign object in a wireless power transmitting system.

Another object of the present invention is to provide an apparatus and method for detecting a foreign object in an initial recognition stage.

Another object of the present invention is to provide an apparatus and method for detecting a foreign object based on a current induced in a primary coil in a wireless power transmitting system.

Another object of the present invention is to provide an apparatus and method for limiting power in response to detection of a foreign object in a wireless power transmitting system.

Another object of the present invention is to provide a wireless power transmitting apparatus having a foreign object detection function and a method thereof in a wireless power transmitting system.

According to an aspect of the present invention, there is provided a method for detecting a foreign object by a wireless power receiving apparatus, including: attempting to detect a foreign object prior to initial charging; when a foreign object is not detected before charging is initiated, attempting to detect a foreign object during charging, by using one-way communication or two-way communication; and when a foreign object is not detected by the attempt to detect the foreign object during charging, detecting a fine foreign object which has not been detected using a temperature sensor, and limiting power appropriately.

According to another object of the present invention, there is provided a wireless power receiving apparatus including: a secondary core block, coupled to a primary core block provided in a wireless power transmitting apparatus through magnetic induction or magnetic resonance to receive wireless power from the wireless power transmitting apparatus; a rectifying unit connected to the secondary core block, wherein the rectifying unit performs full-wave rectification on a alternating current (AC) waveform generated by the secondary core block to provide power to a control unit and an external load; and a control unit, wherein the control unit measures an initial voltage of an output terminal connected to the external load, and controls the wireless power receiving apparatus to enter a foreign object detection phase when the initial voltage is within a reference voltage range. The control unit may attempts to detect a foreign object prior to initial charging, and if a foreign object is not detected before charging is initiated, the control unit may attempt to detect a foreign object during charging by using one-way communication or two-way communication, and if a foreign object is not detected during attempt to detect a foreign object during charging, the controller attempts to detect a fine foreign object which has not been detected using a temperature sensor, and limits power appropriately.

According to embodiments of the present invention, since the wireless power transmitting apparatus detects a foreign object before charging starts and at a certain point in time during charging, the probability of detecting a foreign object may be increased. Also, since a method for detecting a foreign object is clearly defined by stages, implementation of foreign object detection may be facilitated. In addition, the wireless power transmitting apparatus may detect a foreign object based on information exchanged with a wireless power receiving apparatus and/or by itself without such information, depending on the embodiment, and thus foreign object detection compatible in various products may be provided. When a foreign object is detected, wireless power transmission may be stopped or a user may remove the foreign object, whereby damage to a device due to a foreign object may be prevented.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings, of which.

DETAILED DESCRIPTION OF THE EMBODIMENTS

Figure 1:
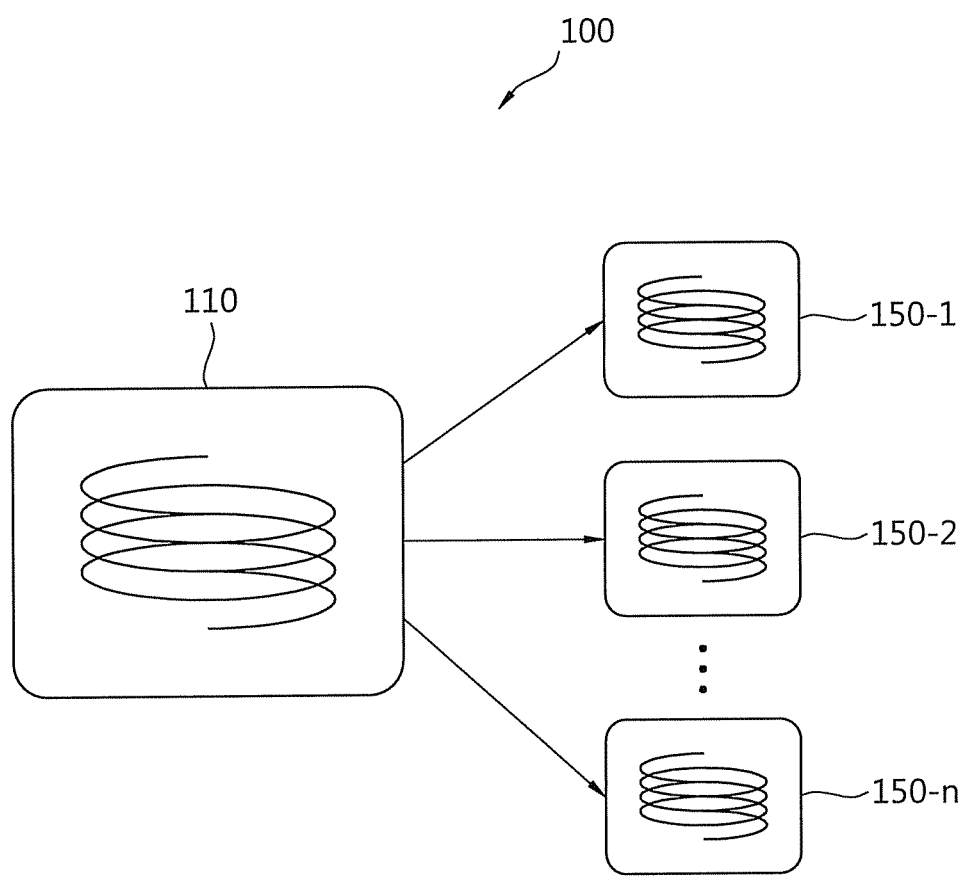
FIG. 1 is a view illustrating components of a wireless power transmitting system according to an embodiment of the present invention.

Reference will now be made in detail to embodiments of the present invention, examples of which are illustrated in the accompanying drawings, wherein like reference numerals refer to the like elements throughout. The embodiments are described below in order to explain the present invention by referring to the figures.

The term "wireless power" is used to denote the energy of arbitrary shape related to electric fields, magnetic fields, and electromagnetic fields transmitted from a transmitter to a receiver without employing physical electromagnetic conductors. The wireless power may be called a power signal and may indicate an oscillating magnetic flux enclosed by a primary and secondary coil. For example, this document describes power transformation of a system intended to wirelessly charge devices including but not limited to mobile phones, cordless phones, iPods, MP3 players, and headsets. In general, basic principles of wireless transfer of energy rely on magnetic inductive coupling, magnetic resonance coupling (for instance, resonance induction) utilizing frequencies below 30 MHz, or both. For relatively high radiation levels, various frequencies below 135 kHz (LF) or above 13.56 MHz (HF), which include license-free frequencies, may be utilized.

FIG. 1 is a block diagram illustrating constituting elements of a wireless power transmitting system according to one embodiment of the present invention.

With reference to FIG. 1, a wireless power transmitting system 100 comprises a wireless power transmitting apparatus 110 and n wireless power receiving apparatus 150-1, . . . , 150-n. Although a plurality of wireless power receiving apparatuses 150-1, . . . , 150-n are depicted, and will be referred to in reference to FIG. 1 for convenience, the invention is not so limited and may function with only one wireless power receiving apparatus 150-1, as will become clear.

The wireless power transmitting apparatus 110 includes a primary core block. The primary core block may comprise a core and one or more primary coils 111. The wireless power transmitting apparatus 110 may have an arbitrary shape. For example, the apparatus may take the shape of a flat platform with a power transmission surface; each wireless power receiving apparatus 150-1, . . . , 150-n may be disposed on or around the platform.

The wireless power receiving apparatuses 150-1, . . . , 150-n may be separated from the wireless power transmitting apparatus 110. Each of the wireless power receiving apparatuses 150-1, . . . , 150-n is equipped with a secondary core block coupled with an electromagnetic field generated by the primary core block of the wireless power transmitting apparatus 110 in the vicinity thereof. Each secondary core block may comprise one or more secondary coils.

The wireless power transmitting apparatus 110 transmits power to the wireless power receiving apparatuses 150-1, . . . , 150-n without a direct electric contact. In this case, the primary core block and secondary core block are referred to as being coupled with each other through magnetic induction or resonance induction. The primary and secondary coil may assume an arbitrary shape relevant to each other; as one example, the coils may be in the form of copper wires wound along the periphery of a block made from a high permeability material such as ferrite or amorphous metal.

The wireless power receiving apparatus 150-1, . . . , 150-n are connected to an external load (not shown) and provide power received wirelessly from the wireless power transmitting apparatus 110 to the external load. For example, the wireless power receiving apparatuses 150-1, . . . , 150-n may each convey the received power to an object which consumes or stores electric power, such as a portable electric or electronic device, rechargeable battery cell, or battery.

Figure 2:
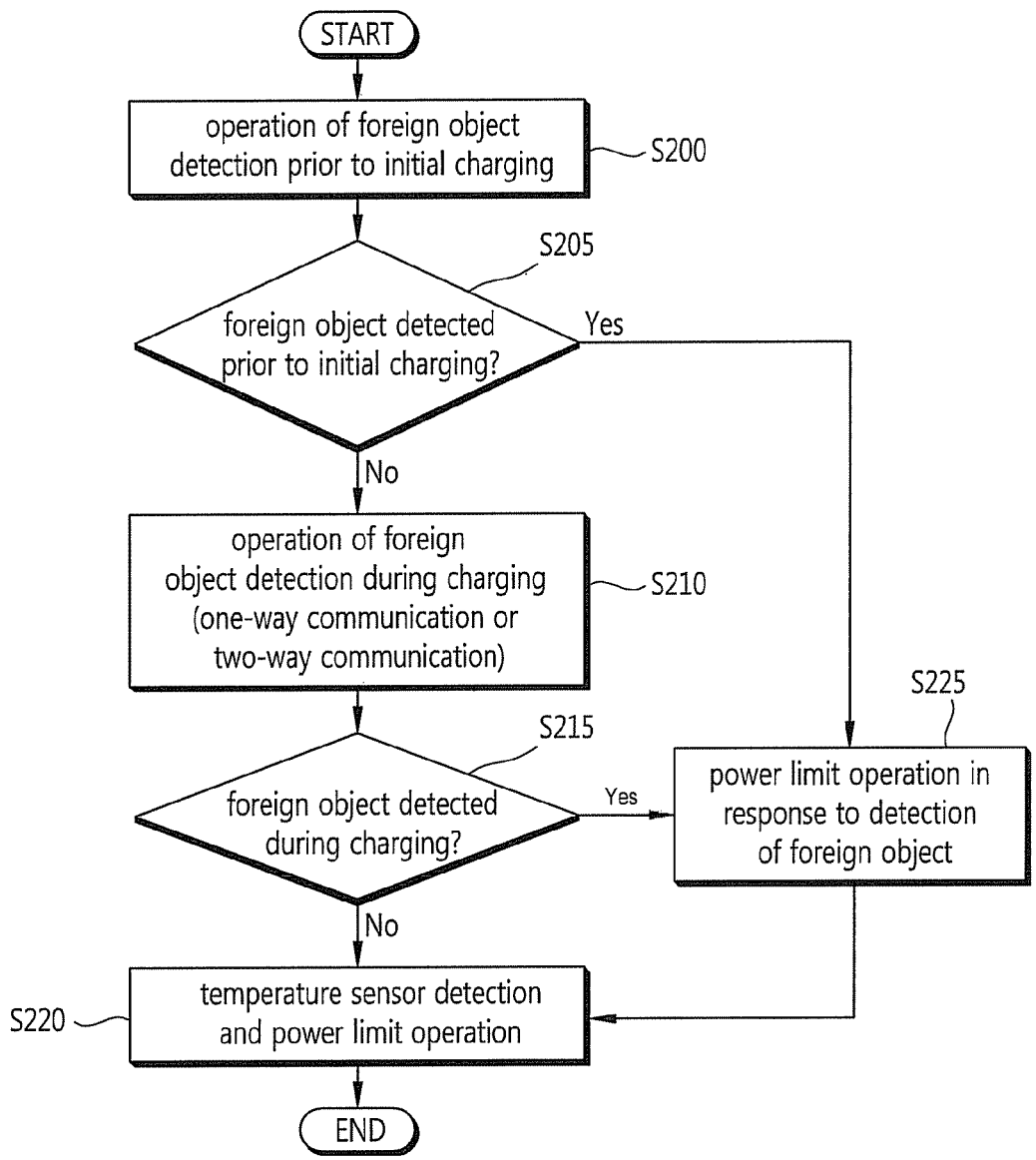
FIG. 2 is a flow chart illustrating a method for detecting a foreign object in a wireless power transmitting system according to an embodiment of the present invention.

FIG. 2 is a flow chart illustrating method for detecting a foreign object in a wireless power transmitting system according to an embodiment of the present invention.

Referring to FIG. 2, a wireless power transmitting apparatus or a wireless power receiving apparatus performs an operation of foreign object detection prior to initial charging (S200). For example, the operation of foreign object detection prior to initial charging may be performed based on an embodiment illustrated in FIG. 5.

The wireless power transmitting apparatus or the wireless power receiving apparatus determines whether a foreign object is detected prior to initial charging (S205). When a foreign object is detected prior to initial charging, the wireless power transmitting apparatus or the wireless power receiving apparatus performs a power limit operation in response to the detection of the foreign object (S225).

If a foreign object is not detected prior to the initial charging then, after charging starts, the wireless power transmitting apparatus or the wireless power receiving apparatus performs an operation of foreign object detection during charging (S210).

In one example, the wireless power transmitting apparatus or the wireless power receiving apparatus may detect a foreign object by performing one-way communication during charging. For example, the operation of foreign object detection using one-way communication during charging may be performed based on the embodiment illustrated in FIG. 6.

In another example, the wireless power transmitting apparatus or the wireless power receiving apparatus may detect a foreign object by performing two-way communication during charging. For example, the operation of foreign object detection using two-way communication during charging may be performed based on the embodiment illustrated in FIG. 7.

In yet another example, the wireless power transmitting apparatus or the wireless power receiving apparatus may detect a foreign object by simultaneously or independently performing one-way communication and two-way communication during charging (operation not depicted).

The wireless power transmitting apparatus or the wireless power receiving apparatus determines whether a foreign object is detected during charging (S215). When a foreign object is detected during charging, the wireless power transmitting apparatus or the wireless power receiving apparatus may perform a power limiting operation in response to the detection of the foreign object as in operation S225.

If a foreign object is not detected during charging, a problem may arise in power transmission due to a fine foreign object which has not been detected, and thus, the wireless power transmitting apparatus or the wireless power receiving apparatus may limit power based on a temperature sensor or thermistor (S220). The temperature sensor may be equipped in the wireless power transmitting apparatus or the wireless power receiving apparatus. The wireless power transmitting apparatus or the wireless power receiving apparatus may limit power by cutting off power entirely, or by some other method.

Similarly, even if the power limiting operation is performed in response to the detection of a foreign object at S225, a problem may still arise in power transmission due to a fine foreign object which has not been detected, and thus, the wireless power transmitting apparatus or the wireless power receiving apparatus limits power based on the temperature sensor or thermistor (again, S220).

Figure 3:
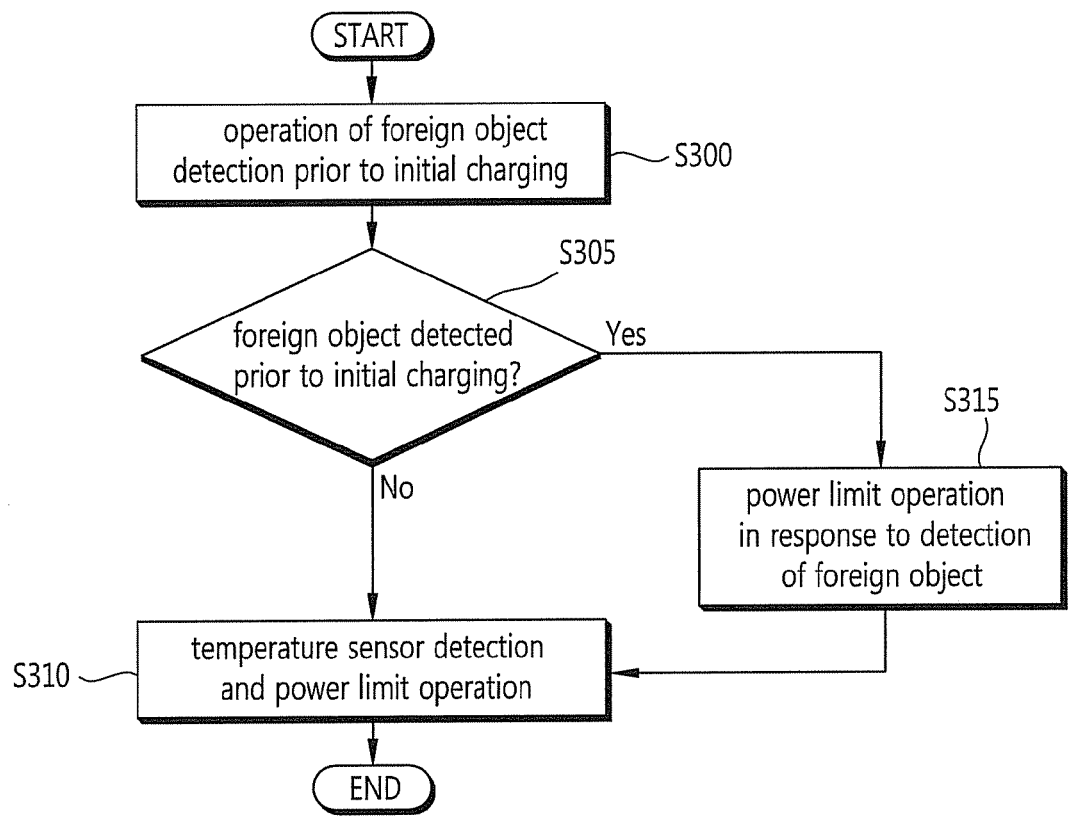
FIG. 3 is a flow chart illustrating a method for detecting a foreign object in a wireless power transmitting system according to another embodiment of the present invention.

FIG. 3 is a flow chart illustrating a method for detecting a foreign object in a wireless power transmitting system according to another embodiment of the present invention.

Referring to FIG. 3, the wireless power transmitting apparatus or the wireless power receiving apparatus performs an operation of foreign object detection prior to initial charging (S300). For example, the operation of foreign object detection prior to initial charging may be performed based on the embodiment illustrated in FIG. 5.

The wireless power transmitting apparatus or the wireless power receiving apparatus determines whether a foreign object is detected prior to initial charging (S305). When a foreign object is detected prior to initial charging, the wireless power transmitting apparatus or the wireless power receiving apparatus performs a power limiting operation in response to the detection of the foreign object (S315).

If a foreign object is not detected prior to the initial charging, a problem may arise in power transmission due to a fine foreign object which has not been detected, and thus, the wireless power transmitting apparatus or the wireless power receiving apparatus may limit power based on a temperature sensor or thermistor (S310). The temperature sensor may be equipped in the wireless power transmitting apparatus or the wireless power receiving apparatus. The wireless power transmitting apparatus or the wireless power receiving apparatus may limit power by cutting off power entirely, or by some other method.

Similarly, even if the power limiting operation is performed in response to the detection of a foreign object at S315, a problem may still arise in power transmission due to a fine foreign object which has not been detected, and thus, the wireless power transmitting apparatus or the wireless power receiving apparatus limits power based on the temperature sensor or thermistor (again, S220).

Figure 4:
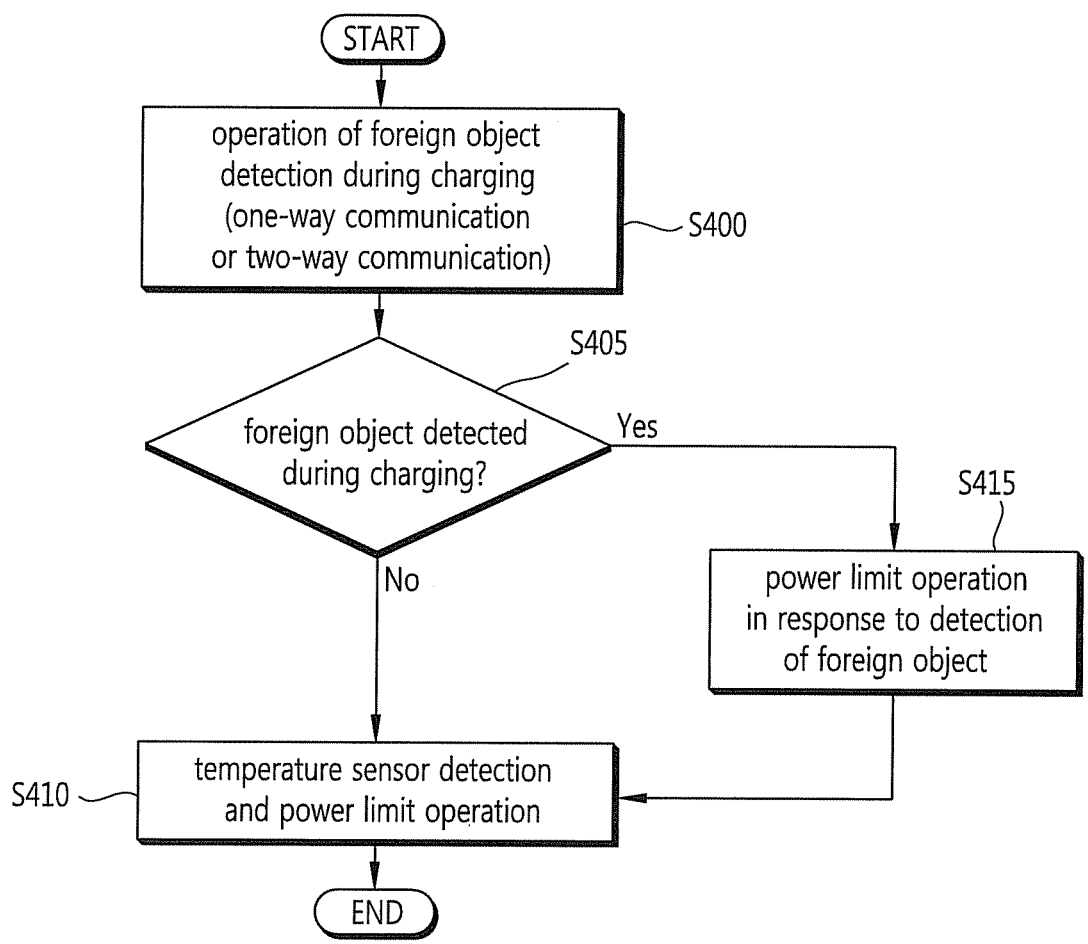
FIG. 4 is a flow chart illustrating a method for detecting a foreign object in a wireless power transmitting system according to yet another embodiment of the present invention.

FIG. 4 is a flow chart illustrating a method for detecting a foreign object in a wireless power transmitting system according to yet another embodiment of the present invention.

Referring to FIG. 4, when charging starts, the wireless power transmitting apparatus or the wireless power receiving apparatus performs an operation of foreign object detection during charging (S400).

In one example, the wireless power transmitting apparatus or the wireless power receiving apparatus may detect a foreign object by performing one-way communication during charging. For example, the operation of foreign object detection using one-way communication during charging may be performed based on the embodiment illustrated in FIG. 6.

In another example, the wireless power transmitting apparatus or the wireless power receiving apparatus may detect a foreign object by performing two-way communication during charging. For example, the operation of foreign object detection using two-way communication during charging may be performed based on the embodiment illustrated in FIG. 7.

In yet another example, the wireless power transmitting apparatus or the wireless power receiving apparatus may detect a foreign object by simultaneously or independently performing one-way communication and two-way communication during charging (operation not depicted).

The wireless power transmitting apparatus or the wireless power receiving apparatus determines whether a foreign object is detected during charging (S405). When a foreign object is detected during charging, the wireless power transmitting apparatus or the wireless power receiving apparatus may perform a power limit operation in response to the detection of the foreign object as in operation S415.

If a foreign object is not detected during charging, a problem may arise in power transmission due to a fine foreign object which has not been detected, and thus, the wireless power transmitting apparatus or the wireless power receiving apparatus may limit power based on a temperature sensor or thermistor (S410). The temperature sensor may be equipped in the wireless power transmitting apparatus or the wireless power receiving apparatus. The wireless power transmitting apparatus or the wireless power receiving apparatus may limit power by cutting off power entirely, or by some other method.

Similarly, if after the power limiting operation is performed in response to the detection of a foreign object at S415, a problem may still arise in power transmission due to a fine foreign object which has not been detected, and thus, the wireless power transmitting apparatus or the wireless power receiving apparatus limits power based on the temperature sensor or thermistor (again, S220).

Hereinafter, an operation of foreign object detection prior to initial charging and an operation of foreign object detection during charging (for example, using one-way communication or two-way communication) according to an embodiment of the present invention will be separately described.

<1. Operation of Foreign Object Detection Prior to Initial Charging>

Figure 5:
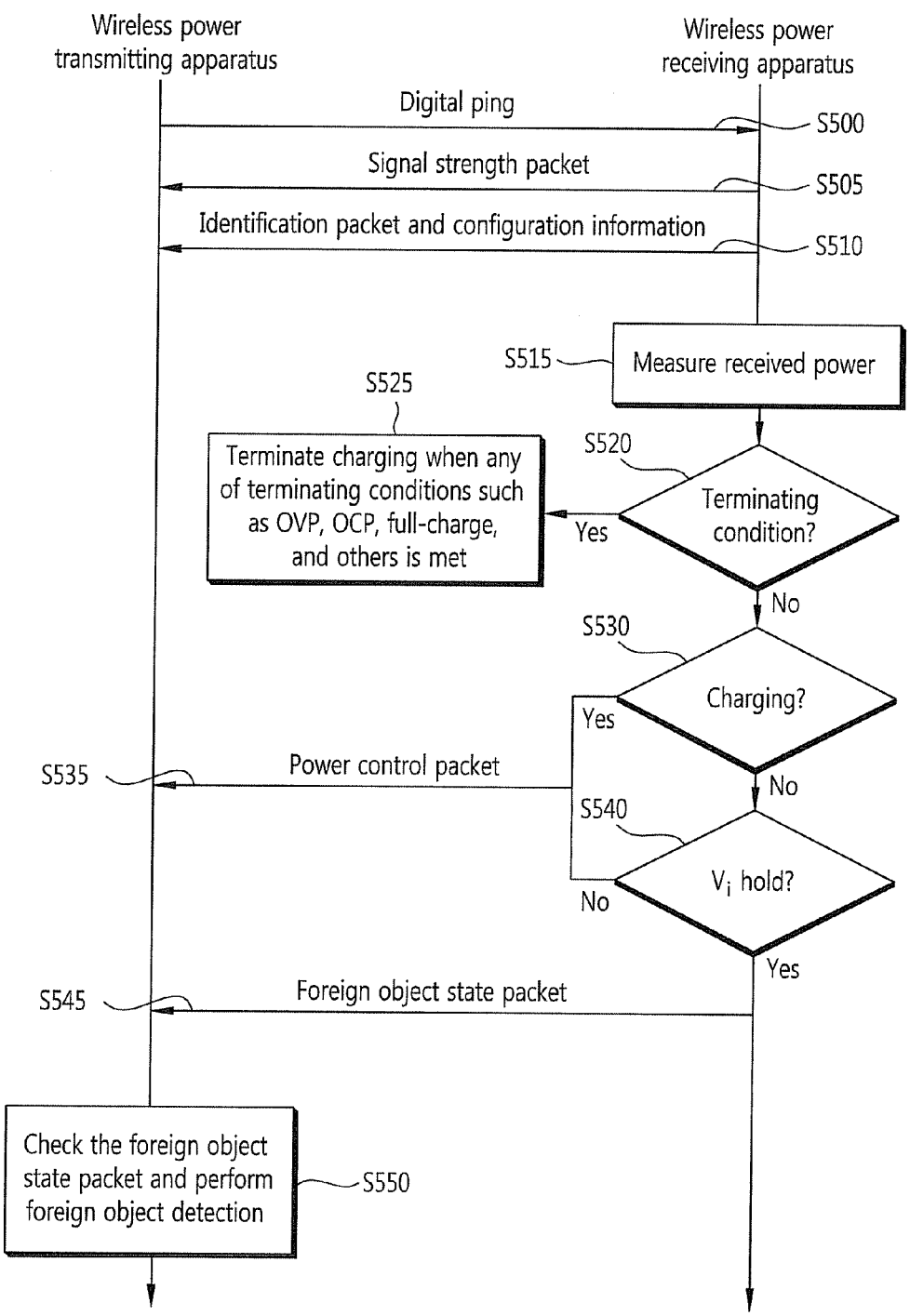
FIG. 5 is a flow chart illustrating an operation for detecting a foreign object in a wireless power transmitting system prior to initial charging according to an embodiment of the present invention.

FIG. 5 is a flow chart illustrating an operation for detecting a foreign object in a wireless power transmitting system prior to initial charging according to an embodiment of the present invention, which corresponds to operation S200 in FIG. 2 or operation S300 in FIG. 3.

With reference to FIG. 5, the wireless power transmitting apparatus in the ping phase performs a digital ping in which the wireless power transmitting apparatus transmits a power signal at an operating point to a wireless power receiving apparatus (S500).

After receiving a power signal in the ping phase, the wireless power receiving apparatus generates a signal strength packet indicating a strength of the received power signal and transmits the signal strength packet to the wireless power transmitting apparatus (S505). The wireless power receiving apparatus also generates an identification packet indicating a unique ID of the wireless power receiving apparatus and configuration information thereof, and transmits the identification packet and configuration information to the wireless power transmitting apparatus (S510).

The wireless power receiving apparatus measures a received power (S515). From this moment, the wireless power receiving apparatus enters a phase meant for setting up an initial voltage $V_i$.

The wireless power receiving apparatus checks whether a terminating condition such as an over voltage power (OVP), over current power (OCP), or full charge is met (S520). If any of the terminating conditions such as OVP, OCP, full charge, or others is met, the wireless power receiving apparatus terminates the charging (S525). If the terminating conditions is not met, the wireless power receiving apparatus checks whether it is in the middle of receiving wireless power from the wireless power transmitting apparatus; that is, whether it is charging (S530).

If it is determined at S530 that the wireless power receiving apparatus is charging, the wireless power receiving apparatus compares a required power value with a received power value, generates a power control packet based on the comparison, and transmits the generated power control packet to the wireless power transmitting apparatus (S535). If it is determined at S530 that the wireless power receiving apparatus is not charging, the wireless power receiving apparatus checks whether the initial voltage $V_i$ is in a hold stage (S540). If the initial voltage $V_i$ in a steady state is within the range of a reference voltage (for example, 7.0 V~10.5 V), the wireless power receiving apparatus completes the initial configuration thereof. By doing so, the initial voltage $V_i$ enters the hold state, and the wireless power receiving apparatus may enter the foreign object detection phase.

If the initial voltage $V_i$ is not in the hold state, the wireless power receiving apparatus generates a power control packet and transmits the generated power control packet to the wireless power transmitting apparatus in the same way as when the wireless power receiving apparatus is charging (S535).

If the initial voltage $V_i$ is in the hold state, the wireless power receiving apparatus enters the foreign object detection phase. At this time, the wireless power receiving apparatus generates a foreign object state packet and transmits the generated foreign object state packet to the wireless power transmitting apparatus (S545).

The foreign object state packet according to one embodiment of the present invention comprises a preamble, header, message, and checksum. The preamble may consist of a minimum of 11 bits to a maximum of 25 bits, and all of the bits may be set to zero. The preamble allows the wireless power transmitting apparatus to accurately detect a start bit of the header of the foreign object state packet and synchronize with incoming data.

The header indicates a packet type and may be comprised of 8 bits. As one example, the value of the foreign object state packet header may be 0x00. In this case, the content of the message may be set to 0, that is, 0x00. As another example, the value of the foreign object state packet header may be set to 0x05, and the same value may be used as the header of a charge state packet. However, if the value of the one byte message of the charge state packet is set to 0x00, the foreign object state packet may be indicated as well. In other words, the foreign object state packet may be included in the charge state packet based on the message of the charge state packet. Other values and corresponding meanings are also possible without departing from the scope of the invention.

The wireless power transmitting apparatus determines, on the basis of the header value of a received packet or the value of a received message, whether the received packet is the foreign object state packet. If it is determined that the foreign object state packet has been received, the wireless power transmitting apparatus performs foreign object detection (S550). The operations of checking the foreign object state packet and foreign object detection may be performed by a control unit of the wireless power transmitting apparatus.

<2. Detection of Foreign Object During Charging>
<2-1. Detection of Foreign Object Using One-Way Communication During Charging>

Figure 6:
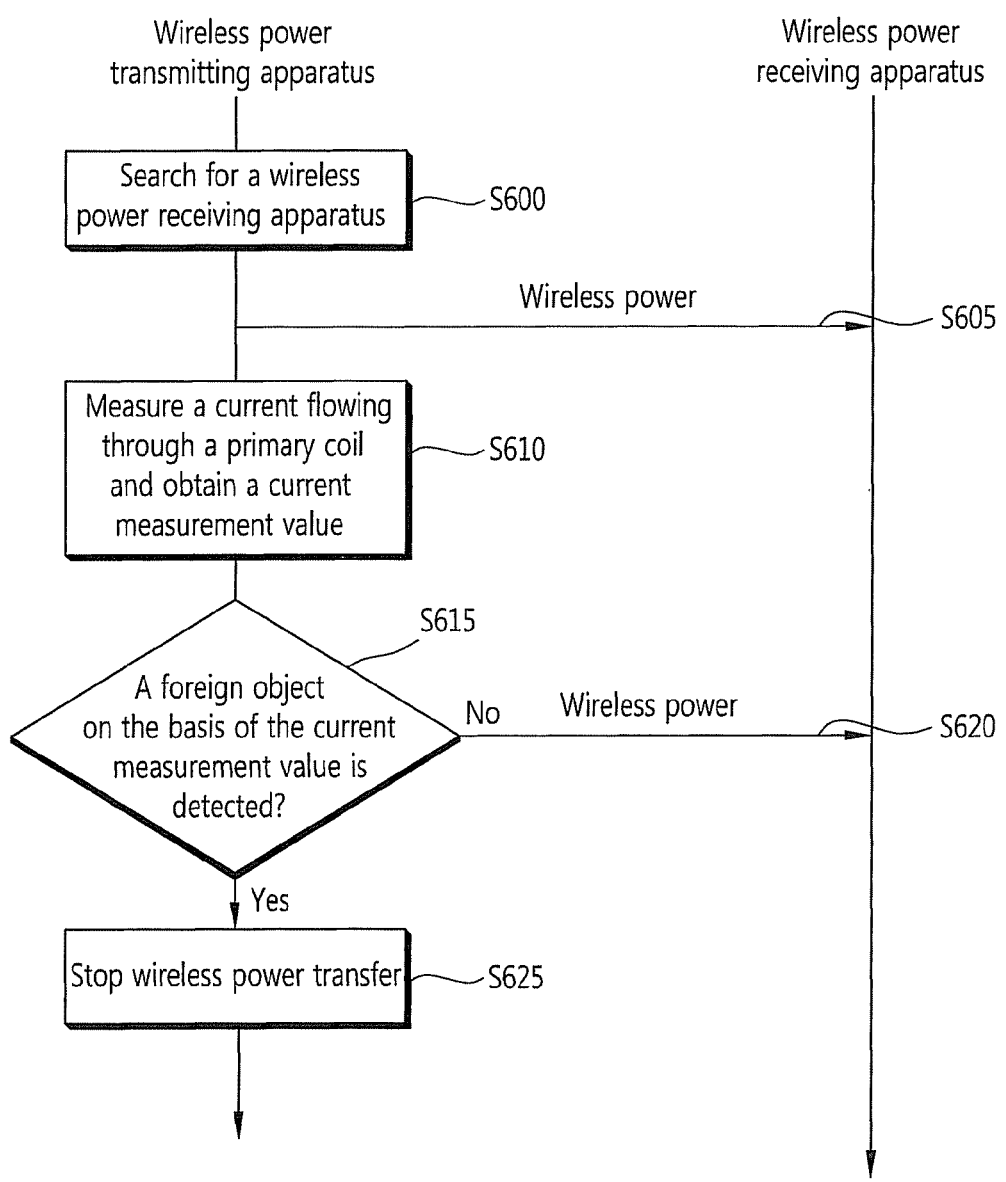
FIG. 6 is a flow chart illustrating an operation of a wireless power transmitting system for detecting a foreign object in a wireless power transmitting system during charging according to an embodiment of the present invention.

FIG. 6 is a flow chart illustrating an operation of a wireless power transmitting system for detecting a foreign object in a wireless power transmitting system during charging according to an embodiment of the present invention, which corresponds to operation S210 in FIG. 2 or operation S400 in FIG. 4.

With reference to FIG. 6, the wireless power transmitting apparatus searches for a wireless power receiving apparatus (S600). At this time, the wireless power transmitting apparatus is in a standby mode until a wireless power receiving apparatus is found.

If a detected object is a wireless power receiving apparatus, the wireless power transmitting apparatus enters a charging mode and transmits wireless power to the wireless power receiving apparatus (S605). In the charging mode, the wireless power transmitting apparatus applies electric power to the primary coil and generates an induced magnetic field or resonance.

The wireless power transmitting apparatus measures a current flowing through the primary coil and obtains a current measurement value $I_{measured}$ from the current flowing through the primary coil (S610). The current measured by the wireless power transmitting apparatus may be an alternating current. The current measurement value $I_{measured}$ may have been converted to a DC value appropriate for the control unit within the wireless power transmitting apparatus to recognize. In other words, the wireless power transmitting apparatus measures a relatively high alternating current flowing through the primary coil and maps the measured high current into a current measurement value appropriate for analysis.

The wireless power transmitting apparatus uses one, or a combination of two or more, of the parameters such as current measurement value $I_{measured}$, reference current $I_{ref}$, reference range ($I_{low}$~$I_{high}$), reference AC signal, and foreign object detection time t to check if a foreign object is detected (S615). The parameters such as the reference current $I_{ref}$, reference range ($I_{low}$~$I_{high}$), reference AC signal, and foreign object detection time t may be stored in the wireless power transmitting apparatus as the initial setting values.

The wireless power transmitting apparatus transmits power to the wireless power receiving apparatus continuously if a foreign object is not detected (S620). Additionally, the wireless power transmitting apparatus again obtains a current measurement value of the primary coil at the time t predetermined by system or standard (S610) and attempts to detect a foreign object on the basis of the obtained measurement value (S615).

On the other hand, if a foreign object is detected, the wireless power transmitting apparatus blocks wireless power which is being transmitted to the wireless power receiving apparatus (S625).

<2-2. Operation of Foreign Object Detection Using Two-Way Communication During Charging>

Figure 7:
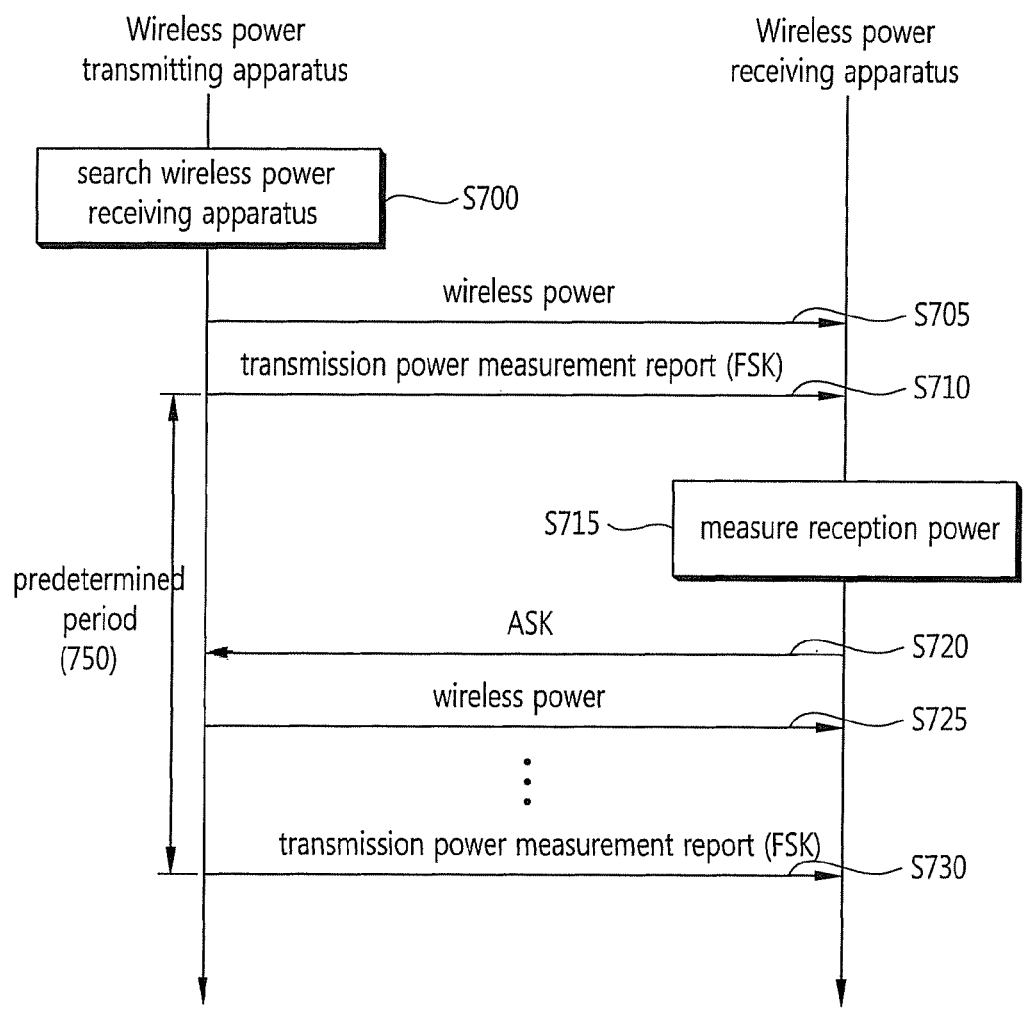
FIG. 7 is a flow chart illustrating an operation of a wireless power transmitting system for detecting a foreign object in a wireless power transmitting system during charging according to another embodiment of the present invention.

FIG. 7 is a flow chart illustrating an operation of a wireless power transmitting system for detecting a foreign object in a wireless power transmitting system during charging according to another embodiment of the present invention, which corresponds to operation S210 in FIG. 2 or operation S400 in FIG. 4.

In this embodiment, the wireless power transmitting system may perform a two-way communication as follows. When a wireless power transmitting apparatus transmits power to a wireless power receiving apparatus, the wireless power receiving apparatus provides information regarding a received power value to the wireless power transmitting apparatus, and when a power loss value exceeds a predetermined reference value, foreign object detection (FOD) is positive. For example, in performing two-way communication, in a case in which the wireless power transmitting apparatus transmits power of 7 W to 10 W to the wireless power receiving apparatus, and the wireless power receiving apparatus receives power of 5 W, the wireless power receiving apparatus provides the received power value of "5 W" to the wireless power transmitting apparatus, and here, since power loss stands at 2 W or more, greater than 1 W as a predetermined reference value, the wireless power transmitting apparatus or the wireless power receiving apparatus determines FOD is positive. In this manner, FOD may occur in the power transmission stage.

The two-way communication will be described in detail with reference to FIG. 7. The wireless power transmitting apparatus searches for a wireless power receiving apparatus (S700). Here, the wireless power transmitting apparatus is in standby for charging until a wireless power receiving apparatus is detected.

When a detected object is a wireless power receiving apparatus, the wireless power transmitting apparatus enters a charge mode and transmits wireless power to the wireless power receiving apparatus (S705). In the charge mode, the wireless power transmitting apparatus applies power to a primary coil to generate an induction magnetic field or resonance.

The wireless power transmitting apparatus transmits a transmission power measurement report indicating a measured transmission power to the wireless power receiving apparatus (S710). For example, the wireless power transmitting apparatus may transmit the transmission power measurement report as a frequency shift keying (FSK) signal to the wireless power receiving apparatus. Here, the FSK signal refers to a signal transmitted by using an FSK scheme.

The FSK signal may include a simple power amount (e.g., an amount of transmission power). Here, the wireless power transmitting apparatus may transmit the FSK at least once during a predetermined period 750. This is because the wireless power receiving apparatus may not know a specific transmission time of the FSK signal. The predetermined period may be an interval during which a predetermined number of data signals (for example, a predetermined number of amplitude shift keying (ASK) signals) are transmitted.

The amount of transmission power may be a value obtained by measuring power generated by a primary coil according to an AC current signal by the wireless power transmitting apparatus.

The FSK signal may refer to a signal transmitting a value 0 and a value 1 by switching or selecting a variable frequency (for example, 140 or 140.3 KHz) of a predetermined range converting a single fixed power frequency $f_0$ (for example, 145 kHz) required for the receiving apparatus. That is, the FSK signal indicates 0 or 1 by switching or selecting a variable frequency of a predetermined range which converts a required fixed power frequency. In another example, the FSK signal refers to a signal transmitting a data signal including a value 0 and a value 1 by using a phase.

The wireless power transmitting apparatus may measure power generated by the primary coil according to an AC signal, configure a transmission power measurement report indicating the measured generated power, and transmit the configured transmission power measurement report to the wireless power receiving apparatus. In this manner, two-way communication may be performed such that control information is either transmitted through a path from the wireless power transmitting apparatus to the wireless power receiving apparatus (for example, as an FSK signal) from the wireless power receiving apparatus to the wireless power transmitting apparatus.

The wireless power transmitting apparatus may perform pulse-width modulation (PWM) by using an inverter, and may generate a frequency allowed for required power (or required power) of the wireless power receiving apparatus.

The required power of the wireless power receiving apparatus generates a duty cycle or a voltage, and the duty cycle or the voltage may be a power value of the wireless power transmitting apparatus.

In the process of transmitting power by the wireless power transmitting apparatus, the wireless power transmitting apparatus transmits a pre-set value (e.g., a voltage or a duty cycle, and a frequency) as a transmission power value to the wireless power receiving apparatus in an FSK signal.

Here, the wireless power receiving apparatus stops transmitting an existing data signal (e.g., an ASK signal) and receives the FSK signal. An operation of receiving the FSK signal may include an operation of demodulating the FSK signal.

The FSK signal may be transmitted by a predetermined period 750. For example, the predetermined period 750 may be a predetermined duration (e.g., 3 seconds or 5 seconds) or may be a transmission interval of a predetermined number of data signals (e.g., ASK signals).

The FSK signal may be transmitted simultaneously with wireless power. Namely, operations S705 and S710 may be simultaneously performed.

Subsequently, the wireless power receiving apparatus measures a received power (S715) and detects a foreign object based on the transmission power measurement report. As one example, the wireless power receiving apparatus may calculate a reception power measurement result using a measured received power value and the generated power measurement report of the FSK signal, and when a difference value is equal to or greater than a predetermined reference value, the wireless power receiving apparatus determines FOD is positive. Alternatively, when the measured received power value is equal to or less than a predetermined reference value, the wireless power receiving apparatus determines FOD is positive.

The reception power measurement result may also, or alternatively, comprise information indicating whether a difference between power indicated by the transmission power measurement report and a required power level is greater than, equal to, or smaller than a threshold value. For example, when a difference between the power indicated by the transmission power measurement report and the required power is greater than the threshold value, the reception power measurement result may be set to 1, and when a difference between the power indicated by the transmission power measurement report and the required power is equal to or smaller than the threshold value, the reception power measurement result may be set to 0. Or, when a difference between the power indicated by the transmission power measurement report and the required power is greater than or equal to the threshold value, reception power measurement result may be set to 1, and when a difference between the power indicated by the transmission power measurement report and the required power is smaller than the threshold value, reception power measurement result may be set to 0. For example, the threshold value may be 1 W. In a situation in which power indicated by the transmission power measurement report is 12 W and the required power is 10 W, a difference therebetween is 2 W, which is greater than 1 W. In this case, the reception power measurement result indicates 1. When a difference between the power indicated by the transmission power measurement report and the required power is greater than the threshold value, it means that a foreign object has been detected.

The wireless power receiving apparatus transmits an ASK signal including the foreign object detection result to the wireless power transmitting apparatus (S720).

The ASK signal may include a signal for controlling power, an FOD signal, an emergency signal, a buffer signal, and the like.

Also, the ASK signal may include required power information of the wireless power receiving apparatus. The required power information refers to information requiring generation of wireless power based on a magnetic induction scheme, and refers to information for rendering the wireless power transmitting apparatus to check the required power information and generate a control signal for inducing power indicated in the required power information. For example, when the required power information indicates 10 W, the wireless power transmitting apparatus generates a control signal to make 10 W transmitted.

The ASK signal may be transmitted in the form of a control error packet, a rectified packet, or a charger state.

Subsequently, the wireless power transmitting apparatus may transmit wireless power based on the received ASK signal (S725).

It is not possible for the data signal (e.g., the ASK signal or the FSK signal) to be transmitted and received simultaneously, so the data signal is transmitted or received sequentially. Meanwhile, since power is continuously generated through an induction frequency, a power signal and a data signal may be transmitted simultaneously. Thus, wireless power may be transmitted simultaneously or occasionally, regardless of a point in time at which the ASK signal and the FSK signal is transmitted and received.

The ASK signal and wireless power may be transmitted and received a plurality of times in operations S720 and S725.

When the predetermined period 750 has lapsed at S710, the wireless power transmitting apparatus transmits a transmission power measurement report, indicating a measured transmission power, to the wireless power receiving apparatus (S730). For example, the wireless power transmitting apparatus transmits the transmission power measurement report as an FSK signal to the wireless power receiving apparatus. The predetermined period 750 may be a predetermined duration (e.g., 3 seconds or 5 seconds) or a transmission interval of a predetermined number of data signals (e.g., ASK signals).

Meanwhile, when the wireless power receiving apparatus determines that a foreign object has been detected, the wireless power transmitting apparatus may take measures on the foreign object detection (not shown). For example, the wireless power transmitting apparatus may enter a blocking mode in which driving of the primary coil is reduced or stopped. Accordingly, heat generation of a parasitic load may be prevented and inefficient supply of induced power may be limited or stopped.

Figure 8:
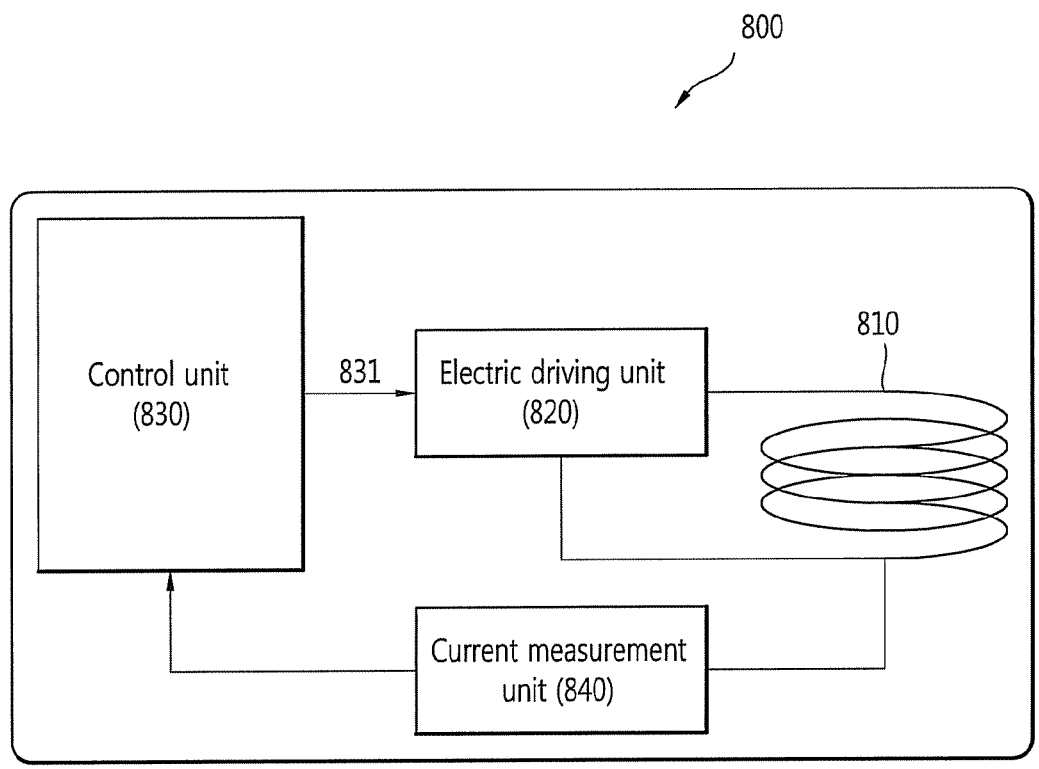
FIG. 8 is a block diagram illustrating a wireless power transmitting apparatus according to an embodiment of the present invention.

FIG. 8 is a block diagram illustrating a wireless power transmitting apparatus according to one embodiment of the present invention.

With reference to FIG. 8, the wireless power transmitting apparatus 800 comprises a primary coil 810, electric driving unit 820, control unit 830, and current measurement unit 840.

The electric driving unit 820 is connected to the primary coil 810 and may apply electric driving signals, namely AC signals, to the primary coil 810 to generate an electromagnetic field.

The control unit 830 is connected to the electric driving unit 820, generates a control signal 831 which controls an AC signal needed for the primary coil 810 to generate an induced magnetic field or magnetic resonance, and provides the generated control signal to the electric driving unit 820.

The control unit 830 controls the operation of the wireless power transmitting apparatus 800 in a ping phase, ID identification and configuration phase, foreign object detection phase, and power transmission phase. The control unit 830 may generate packets required for each phase and transmit the generated packets to a wireless power receiving apparatus, or receive packets from the wireless power receiving apparatus.

The ping phase may be defined as an attempt to discover an object capable of receiving wireless power. In the ping phase, the control unit 830 performs a digital ping and applies a control signal 831 to the electric driving unit 820 so that the primary coil 810 may transmit a power signal at an operating point. If a correct signal strength packet is received from the wireless power receiving apparatus within a time window, the control unit 830 changes the state of the wireless power transmitting apparatus 800 to the ID identification and configuration phase.

In the ID identification and configuration phase, the control unit 830 identifies the wireless power receiving apparatus and collects configuration information of the wireless power receiving apparatus. At this time, the control unit 830 receives an identification packet from the wireless power receiving apparatus; configuration information may also be received.

In the foreign object detection phase, the control unit 830 performs foreign object detection (FOD). If no foreign object is detected, the control unit 830 changes the state of the wireless power transmitting apparatus 800 to the power transmission phase and applies a control signal 831 to the electric driving unit 820 so that wireless power may be transmitted. In this power transmission phase, the wireless power transmitting apparatus 200 may transmit wireless power to the wireless power receiving apparatus through the primary coil 210. On the other hand, if a foreign object is detected, the control unit 830 stops applying the control signal 831 and enters an emergency mode. According to the phase transition scheme above, before the power transmission phase, foreign object detection is performed. In other words, since foreign object detection is performed right after the wireless power transmitting apparatus 800 and the wireless power receiving apparatus identify (or recognize) each other, a risk due to performing foreign object detection in the middle of transmission of wireless power may be avoided beforehand.

Although the present embodiment separates the foreign object detection phase from the power transmission phase, the two phases may be integrated (or incorporated) into a single phase and controlled as a single phase. Similarly, the foreign object detection phase may be integrated (or incorporated) into the power transmission phase and may be controlled as a single procedure. In what follows, the foreign object detection phase is treated as an independent phase, and descriptions will be provided on the basis of such an assumption, but manners of integrating the phases will be obvious from the description to those of skill in the art.

The current measurement unit 840 obtains a current measurement value $I_{measured}$ from the current flowing through the primary coil 810 and provides the obtained value to the control unit 830. The current measurement value $I_{measured}$ may have been converted to a DC value appropriate for the control unit 830 to recognize. In other words, the current measurement unit 840 measures a relatively high alternating current flowing through the primary coil 810, maps the measured high current into a current measurement value $I_{measured}$ appropriate for analysis by the control unit 830, and provides the current measurement value $I_{measured}$ to the control unit 830.

Hereinafter, operations that each constituting element of the wireless power transmitting apparatus 800 perform to detect a foreign object will be described in detail.

If the control unit 830 sends a control signal 831 corresponding to a reference AC signal to the electric driving unit 820, the electric driving unit 820 applies the reference AC signal to the primary coil 810. Here, the reference AC signal is an AC signal designed to make transmission efficiency of wireless power belong to a nominal range (or designed to satisfy the required electric power level of a receiving apparatus) in an environment free of foreign objects, namely in an environment not suffering from any obstacles against transmission of wireless power. This nominal range may vary depending on the specific configuration and needs of the system, and may be obtained experimentally. If the reference AC signal is applied to the primary coil 810, a reference current $I_{ref}$ flows through the primary coil 810 and a wireless power $W_{ref}$ is transmitted.

If a foreign object comes between the wireless power transmitting apparatus 800 and the wireless power receiving apparatus, the foreign object consumes an amount of power $W_{FO}$, and the wireless power receiving apparatus only receives the remaining power $W_{ref} - W_{FO}$. If the wireless power receiving apparatus fails to receive as much power as $W_{ref}$, the wireless power receiving apparatus may transmit a power increase request message to the wireless power transmitting apparatus 800 to request more power. On the other hand, if the wireless power receiving apparatus receives more power than $W_{ref}$, the wireless power receiving apparatus may transmit a power decrease request message to the wireless power transmitting apparatus 800. Both the power increase request message and the power decrease request message may be called control error packets.

The wireless power receiving apparatus may transmit the power increase request message or power decrease request message to the wireless power transmitting apparatus 800 continuously until the required power is obtained. For example, the wireless power transmitting apparatus 800 which has received the power increase request message may increase intensity of the current flowing through the primary coil 810 in response to the message, so that higher power may be transmitted. More specifically, to make a larger current flow through the primary coil 810, the control unit 830 may adjust a control signal 831 so that an AC signal larger than the reference AC signal may be applied to the primary coil 810. Series of such processes are collectively called power control.

As a result of power control, the current measurement value $I_{measured}$ in the primary coil 810 may become larger than a predetermined range. If a current $I_{measured}$ larger than the reference current $I_{ref}$ is flowing through the primary coil 810 for transmission of required electric power, this indicates a drop of transmission efficiency of wireless power, and implies that a predetermined amount of electric power is continuously consumed due to a foreign object, in addition to the consumption of the wireless power receiving apparatus. Therefore, when a relatively large current flows in the primary coil 810, the control unit 830 decides that a foreign object exists in the transmission path of electric power. In other words, on the basis of the current measurement value $I_{measured}$, the control unit 830 may detect a foreign object such as metal which causes interference on transmission of wireless power.

To detect a foreign object, the control unit 830 may use one, or a combination of two or more, of the parameters such as current measurement value $I_{measured}$, reference current $I_{ref}$, reference range ($I_{low} \sim I_{high}$), reference AC signal, and foreign object detection time t. The parameters such as the reference current $I_{ref}$, reference range ($I_{low} \sim I_{high}$), reference AC signal, and foreign object detection time t may be stored in the control unit 830 as the initial setting values. The reference current $I_{ref}$ and reference range ($I_{low} \sim I_{high}$) may collectively be called reference values.

As one example, the control unit 830 compares the current measurement value $I_{measured}$ with the reference current $I_{ref}$. If the current measurement value $I_{measured}$ exceeds the reference current $I_{ref}$ (that is, if $I_{measured} > I_{ref}$), it is determined that a foreign object has been detected. On the other hand, if the current measurement value $I_{measured}$ is below the reference current $I_{ref}$ (that is, if $I_{measured} \leq I_{ref}$), it is determined that no foreign object is detected. In one embodiment, the reference current $I_{ref}$ may be defined as follows according to the rated power W of the wireless power receiving apparatus.

TABLE 1

| Rx power(unit: W) | Tx AC current(unit: A) | Max AC current(unit: A) |
|---|---|---|
| 2.5 | 0.998 | 1.05 |
| 3 | 1.328 | 1.5 |
| 4 | 1.664 | 1.85 |
| 5 | 1.925 | 2.05 |

With reference to Table 1, when the rated power W of the wireless power receiving apparatus Rx is 2.5 W, 3 W, 4 W, or 5 W, the AC current flowing through the primary core block of the wireless power transmitting apparatus Tx is found experimentally to be 0.998 A, 1.328 A, 1.664 A, or 1.925 A, respectively. And the reference current allowed in the primary core block, namely the value of $I_{ref}$ is 1.05 A, 1.5 A, 1.85 A, or 2.05 A, respectively.

As another example, the control unit 830 examines whether the current measurement Value $I_{measured}$ belongs to the reference range ($I_{low} \sim I_{high}$). If the current measurement value $I_{measured}$ belongs to the reference range (that is, if $I_{low} \leq I_{measured} \leq I_{high}$), it is determined that no foreign object is detected. On the other hand, if the current measurement value $I_{measured}$ is out of the reference range (that is, if $I_{measured} > I_{high}$ or $I_{measured} < I_{low}$), it is determined that a foreign object has been detected.

The control unit 830 may attempt to detect a foreign object at a time t. The time t may be predetermined by the system, or standard.

As one example, the time t at which the control unit 830 attempts detection of a foreign object may be a time point after each power control is complete. For example, the wireless power transmitting apparatus 800 may receive a power increase request message or power decrease request message from the wireless power receiving apparatus and increases or decreases the AC signal accordingly. Afterwards, the control unit 830 may attempt to detect a foreign object by using a current measurement value flowing through the primary coil 810.

As another example, the time t at which the control unit 830 attempts detection of a foreign object may correspond to a predetermined detection period. For example, it is preferable that the detection period should be shorter than the time period needed for a foreign object to develop heat above a predetermined temperature, because serious safety problems such as outbreak of fire or bodily burns may result from excessive heat. Other undesirable factors, including but not limited to overload, may also develop due to the presence of a foreign object within a roughly knowable period of time. Therefore, it is preferable to set the detection period to a value which has been verified by experiments as safe, and by doing so, various factors such as heat developed by a foreign object, which may be caused during wireless charging and lead to a dangerous situation, may be prevented.

When a foreign object is detected, the control unit 830 blocks or stops the wireless power transfer by controlling the electric driving unit 820 so that an AC signal is not applied to the primary coil 810.

Figure 9:
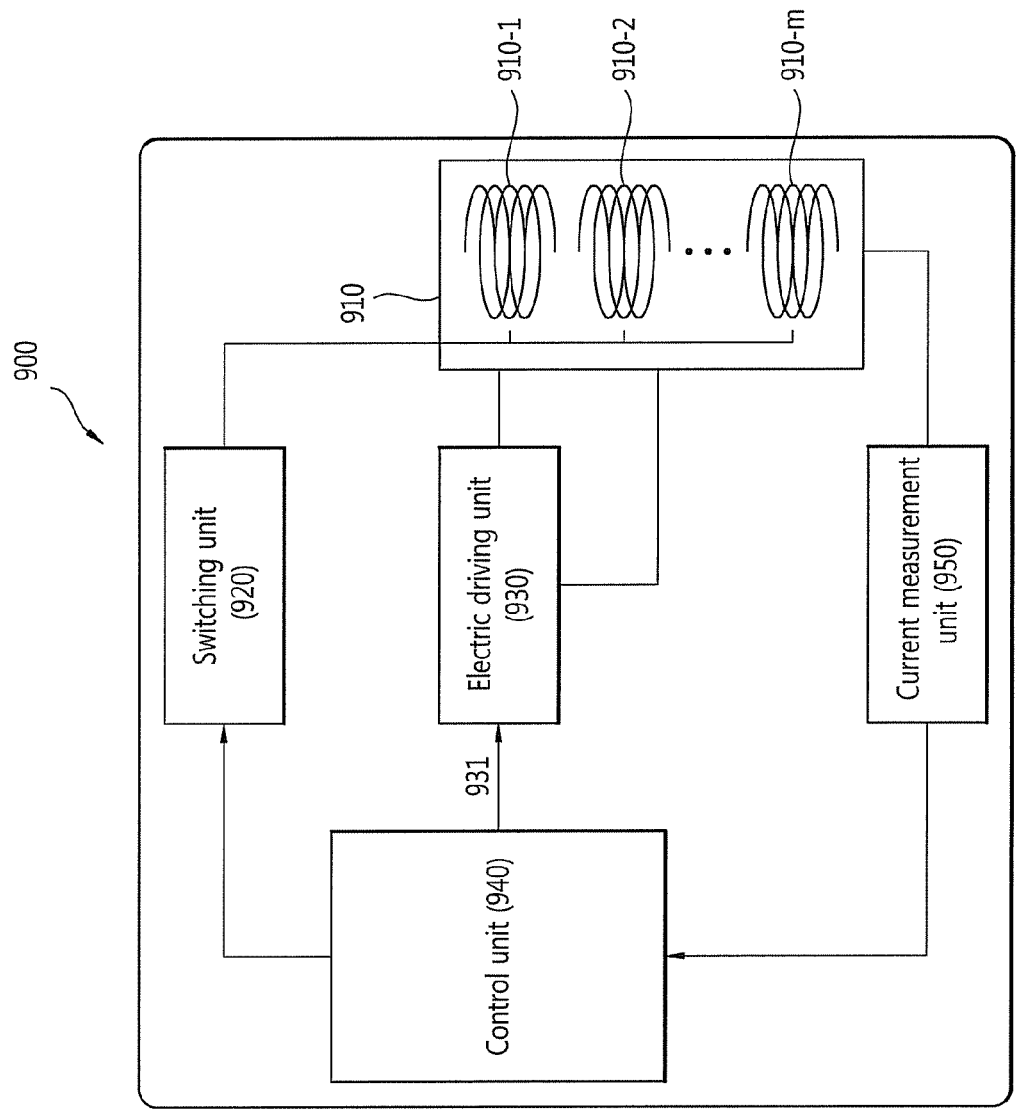
FIG. 9 is a block diagram illustrating a wireless power transmitting apparatus according to another embodiment of the present invention.

FIG. 9 is a block diagram illustrating a wireless power transmitting apparatus according to another embodiment of the present invention.

With reference to FIG. 9, a wireless power transmitting apparatus 900 comprises a primary core block 910 consisting of m primary coils 910-1, . . . , 910-m, a switching unit 920, an electric driving unit 930, a control unit 940, and a current measurement unit 950.

The switching unit 920, by employing a switching method, connects all or at least one of the m primary coils 910-1, . . . , 910-m selectively to the electric driving unit 930.

The electric driving unit 930 is connected to the m primary coils 910-1, . . . , 910-m through the switching unit 920 and may apply electrical driving signals to n primary coils 910-1, . . . , 910-n simultaneously or to at least one primary coil selected from the n primary coils 910-1, . . . , 910-n to generate an electromagnetic field.

The control unit 940, being connected to the electric driving unit 930, generates a control signal 941 which controls an AC signal required for the n primary coils 910-1, . . . , 910-n to generate an induced magnetic field or resonance.

The current measurement unit 950 measures currents flowing into the m primary coils 910-1, . . . , 910-m individually or together. In particular, the current measured by the current measurement unit 950 may be an alternating current. The current measurement unit 950 may comprise a current sensor. Also, the current measurement unit 950 may comprise a transformer used to scale down a high current flowing through the primary coil to a low current.

As one example, the current measurement unit 950 selects only those primary coils through which currents flow from among the m primary coils 910-1, . . . , 910-m, measures the current flowing through the selected primary coils respectively, obtains a plurality of individual current measurement values $I_1, I_2, \ldots, I_m$, and provides the measured values to the control unit 940. The current measurement values $I_1, I_2, \ldots, I_m$ may have been converted to DC values appropriate for the control unit 940 to recognize. In other words, the current measurement unit 950 measures relatively high alternating currents flowing through the primary coils 910-1, . . . , 910-m, maps the measured high currents into current measurement values $I_1, I_2, \ldots, I_m$ appropriate for analysis by the control unit 940, and provides the current measurement values $I_1, I_2, \ldots, I_m$ to the control unit 940.

As another example, the current measurement unit 950 selects only those primary coils through which currents flow from among the m primary coils 910-1, . . . , 910-m, measures the currents flowing through the whole of the selected primary coils, and inputs the single, whole current measurement value $I_{SELECTED}$ to the control unit 940.

As yet another example, the current measurement unit 950 measures a total amount of currents flowing through the m primary coils 910-1, . . . 910-m and provides the single, whole current measurement value $I_{TOTAL}$ to the control unit 940.

To detect a foreign object, the control unit 940 may use one or a combination of two or more of the parameters such as current measurement values $I_1, I_2, \ldots, I_m$ (or $I_{SELECTED}$ or $I_{TOTAL}$), reference current $I_{ref}$, reference range ($I_{low} \sim I_{high}$), reference AC signal, and foreign object detection time t. The parameters such as the reference current $I_{ref}$, reference range ($I_{low} \sim I_{high}$), reference AC signal, and foreign object detection time t may be stored in the control unit 940 as the initial setting values. The reference current $I_{ref}$ and reference range ($I_{low} \sim I_{high}$) may collectively be called reference values.

As one example, the control unit 940 compares the current measurement values $I_1, I_2, \ldots, I_m$ individually with the reference current $I_{ref}$. If at least one of the current measurement values $I_1, I_2, \ldots, I_m$ exceeds the reference current $I_{ref}$ (that is, if $I_1$ or $I_2$ or $\ldots I_m > I_{ref}$), it is determined that a foreign object has been detected. On the other hand, all of the current measurement values $I_1, I_2, \ldots, I_m$ are below the reference current $I_{ref}$ (that is, if $I_1$ and $I_2$ and $\ldots I_m \leq I_{ref}$), it is determined that no foreign object is detected.

As another example, the control unit 940 examines whether each of the current measurement values $I_1, I_2, \ldots, I_m$ belongs to the reference range ($I_{low} \sim I_{high}$). If all of the current measurement values $I_1, I_2, \ldots, I_m$ belong to the reference range (that is, if $I_{low} \leq I_1$ and $I_2$ and $\ldots I_m \leq I_{high}$), it is determined that no foreign object is detected. On the other hand, if at least one of the current measurement values $I_1, I_2, \ldots, I_m$ does not belong to the reference range (that is, if $I_1$ or $I_2$ or $\ldots I_m > I_{high}$, or $I_1$ or $I_2$ or $\ldots I_m < I_{low}$), it is determined that a foreign object has been detected.

As yet another example, the control unit 940 compares a current measurement value $I_{SELECTED}$ with the reference current $I_{ref}$. If the current measurement value $I_{SELECTED}$ exceeds the reference current $I_{ref}$ (that is, if $I_{SELECTED} > I_{ref}$), it is determined that a foreign object has been detected. On the other hand, if the current measurement value $I_{SELECTED}$ is below the reference current $I_{ref}$ (that is, if $I_{SELECTED} \leq I_{ref}$), it is determined that no foreign object is detected.

As still another example, the control unit 940 examines whether the current measurement value $I_{SELECTED}$ belongs to the reference range ($I_{low} \sim I_{high}$). If the current measurement value $I_{SELECTED}$ belongs to the reference range (that is, if $I_{low} \leq I_{SELECTED} \leq I_{high}$), it is determined that no foreign object is detected. On the other hand, if the current measurement value $I_{SELECTED}$ does not belong to the reference range (that is, if $I_{SELECTED} > I_{high}$ or $I_{SELECTED} < I_{low}$), it is determined that a foreign object has been detected.

As a further example, the control unit 940 compares a current measurement value $I_{TOTAL}$ with the reference current $I_{ref}$. If the current measurement value $I_{TOTAL}$ exceeds the reference current $I_{ref}$ (that is, if $I_{TOTAL} > I_{ref}$), it is determined that a foreign object has been detected. On the other hand, if the current measurement value $I_{TOTAL}$ is below the reference current $I_{ref}$ (that is, if $I_{TOTAL} \leq I_{ref}$), it is determined that no foreign object is detected.

As an additional example, the control unit 940 examines whether the current measurement value $I_{TOTAL}$ belongs to the reference range ($I_{low} \sim I_{high}$). If the current measurement value $I_{TOTAL}$ belongs to the reference range (that is, if $I_{low} \leq I_{TOTAL} \leq I_{high}$), it is determined that no foreign object is detected. On the other hand, if the current measurement value $I_{TOTAL}$ does not belong to the reference range (that is, if $I_{TOTAL} > I_{high}$ or $I_{TOTAL} < I_{low}$), it is determined that a foreign object has been detected.

The control unit 940 may attempt to detect foreign objects at a time t. The time t may be predetermined by the system, or standard.

As one example, the time t at which the control unit 940 attempts to detect foreign objects may be a time point after each power control is complete. For example, the wireless power transmitting apparatus 900 may receive a power increase request message or power decrease request message from the wireless power receiving apparatus and increase or decrease the AC signal accordingly. Afterwards, the control unit 340 may attempt to detect a foreign object by using a measurement value of the current flowing through the primary core block 910.

As another example, the time t at which the control unit 940 attempts to detect foreign objects may be defined according to a predetermined detection period. For example, it is preferable that the detection period should be shorter than the time period required for a foreign object to develop heat above a predetermined temperature, because a serious safety problem such as outbreak of fire or bodily burns may result from excessive heat. Other undesirable factors, including but not limited to overload, may also develop due to the presence of a foreign object within a roughly knowable period of time. Therefore, it is preferable to set the detection period to a value which has been verified by experiments as safe, and by doing so, various factors such as heat developed by a foreign object, which may be caused during wireless charging and lead to a dangerous situation, may be prevented.

When a foreign object is detected, the control unit 940 blocks or stops the wireless power transfer by controlling the electric driving unit 930 so that an AC signal is not applied to the primary coil 910.

The wireless power transmitting apparatus 110 of FIG. 1 may correspond to the wireless power transmitting apparatus 800 of FIG. 8 or wireless power transmitting apparatus 900 of FIG. 9.

According to an embodiment of the present invention, signaling overhead may be reduced since it is not necessary for the wireless power receiving apparatus to transmit particular information to the wireless power transmitting apparatus according to a predefined information transmission specification to detect a foreign object.

Detection of a foreign object with the least delay before the foreign object develops heat is a very important technical issue. This is so because if a foreign object readily develops heat by nature, a long delay before detecting the foreign object may cause a serious problem. Since the wireless power transmitting apparatus may detect a foreign object autonomously, however, the present invention provides an advantageous effect of obviating a delay consequent to detection of the foreign object, namely the time period for the wireless power receiving apparatus to generate particular information, the time period for the particular information to be transmitted to the wireless power transmitting apparatus, and the time period for the wireless power transmitting apparatus 200 to decode and analyze the particular information.

Furthermore, even if the wireless power receiving apparatus is of a low version model unable to transmit the particular information, the wireless power transmitting system according to the present invention may still ensure compatibility with the low version model.

Figure 10:
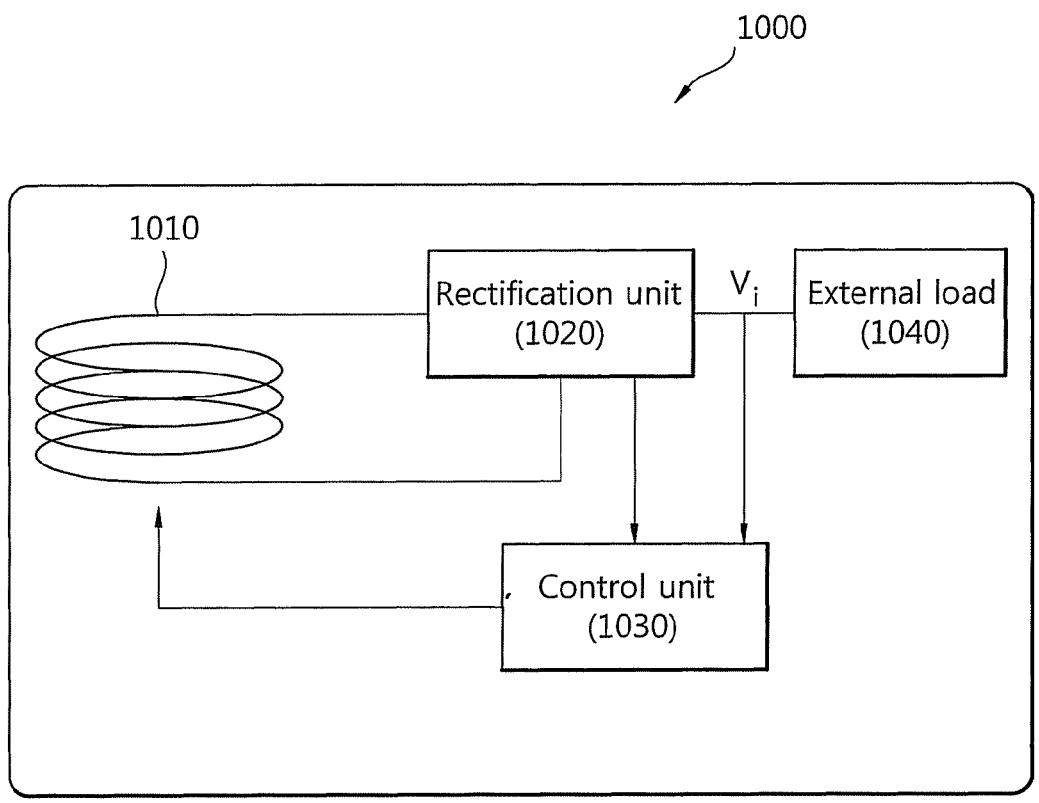
FIG. 10 is a block diagram illustrating a wireless power receiving apparatus according to an embodiment of the present invention.

FIG. 10 is a block diagram illustrating a wireless power receiving apparatus according to another embodiment of the present invention.

With reference to FIG. 10, the wireless power receiving apparatus 1000 comprises a secondary coil 1010, a rectification unit 1020, and a control unit 1030.

The rectification unit 1020 provides full-wave rectification of an AC waveform generated in the secondary coil 1010. For example, the rectification unit 1020 may use four diodes forming a full-bridge configuration. Also, the rectification unit 1020 may provide power to the control unit 1030 and the external load 1040.

The control unit 1030 receives power from the rectification unit 1020 and performs operations such as packet generation and transmission at each phase and control of wireless power transmission. As one example, a load modulation technique may be used for packet transmission. In this case, a packet is transmitted through the secondary coil 1010, and the same frequency band as used for wireless power transmission is employed. As another example, a frequency band separate from the frequency band meant for wireless power transmission may be employed for packet transmission, and packets may be transmitted using techniques including but not limited to RFID (Radio Frequency Identification), Bluetooth, or NFC (Near Field Communication).

In the ID identification and configuration phase, the control unit 1030 may generate an identification packet indicating a unique ID of the wireless power receiving apparatus 1000, and may also generate configuration information of the wireless power receiving apparatus 1000. The control unit 1030 transmits the identification packet and/or configuration information to a wireless power transmitting apparatus.

The control unit 1030 may measure an initial voltage $V_i$ of an output terminal connected to an external load. The initial voltage $V_i$ may be the voltage measured before the power transmission phase where wireless power is received and after the ID identification and configuration phase is completed. Alternatively, the initial voltage $V_i$ may be defined as the voltage of an output terminal measured in a standby before wireless charging starts.

If the initial voltage $V_i$ in a steady state is within a range of a reference voltage (for example, 7.0 V~10.5 V), the control unit 1030 enters the foreign object detection phase, generates a foreign object state packet used for foreign object detection, and transmits the foreign object state packet to a wireless power transmitting apparatus. The foreign object state packet is used to initiate or trigger foreign object detection in the wireless power transmitting apparatus.

In the power transmission phase, the control unit 1030 measures power received through the secondary coil 1010, generates a power control packet, and transmits the generated power control packet to the wireless power transmitting apparatus. The power control packet is used to initiate or trigger power transmission by the wireless power transmitting apparatus. In other words, the control unit 1030 may receive required power by using packets necessary for control of wireless power transmission.

All of the aforementioned functions may be performed by a processor including but not limited to a microprocessor, controller, microcontroller, or ASIC (Application Specific Integrated Circuit) controlled by software or program codes implemented to perform the functions. It should be noted that the design, development, and implementation of the codes would be understood clearly to those skilled in the art on the basis of the descriptions of the present invention.

So far, the present invention has been described with reference to embodiments. It should be understood by those skilled in the art, however, that the present invention may be modified or changed in various ways without departing from the technical principles and scope. Therefore, the present invention is not limited to the embodiments above, but the present invention includes all of the embodiments belonging to the technical scope of the present invention defined by the appended claims.

What is claimed is:

1. A method of detecting a foreign object using at least one processor included in a wireless power receiving apparatus, the method comprising:
    performing a first operation of foreign object detection prior to an initial charging;
    performing a second operation of foreign object detection during charging if the foreign object is not detected by the first operation of foreign object detection prior to the initial charging; and
    performing a third operation of foreign object detection by temperature sensor if the foreign object is not detected by the second operation of foreign object detection during charging,
    wherein the first operation of foreign object detection prior to the initial charging comprises:
    receiving a power signal at an operating point from a wireless power transmitting apparatus which performs digital ping in a ping phase;
    generating a signal strength packet indicating strength of the power signal at the operating point and transmitting the signal strength packet to the wireless power transmitting apparatus;
    generating an identification packet indicating a unique ID of the wireless power receiving apparatus and configuration information of the wireless power receiving apparatus, and transmitting the identification packet and the configuration information to the wireless power transmitting apparatus;
    measuring a received power and setting an initial voltage;
    checking whether the wireless power receiving apparatus is charging;
    comparing a required power value with the received power, generating a power control packet based on the comparison result, and transmitting the generated power control packet to the wireless power transmitting apparatus, if the wireless power receiving apparatus is charging;
    checking whether the initial voltage is in a hold state and a steady state value of the initial voltage is within a predetermined reference voltage range, if the wireless power receiving apparatus is not charging; and
    generating a foreign object state packet, and transmitting the foreign object state packet to the wireless power transmitting apparatus, if the initial voltage is in a hold state and the steady state value of the initial voltage is within the predetermined reference voltage range.

2. The method of claim 1, wherein the second operation of foreign object detection during charging comprises:
    receiving wireless power from the wireless power transmitting apparatus if the foreign object is not detected by the wireless power transmitting apparatus.

3. The method of claim 1, wherein the second operation of foreign object detection during charging comprises:
    receiving a transmission power measurement report indicating a measured transmission power from the wireless power transmitting apparatus;
    detecting a foreign object based on a difference value between the measured transmission power and a measured reception power; and
    transmitting an amplitude shift keying (ASK) signal comprising the foreign object detection result to the wireless power transmitting apparatus.

4. The method of claim 3, wherein the transmission power measurement report is transmitted as a frequency shift keying (FSK) signal, and the measured transmission power is obtained by measuring power generated by a primary coil of the wireless power transmitting apparatus.

5. The method of claim 4, wherein the FSK signal is transmitted at least once during each predetermined period, the predetermined period being an interval during which a predetermined number of data signals are transmitted.

6. The method of claim 4, wherein the FSK signal indicates 0 or 1 by switching or selecting a variable frequency of a predetermined range which converts a required fixed power frequency.

7. The method of claim 3, wherein the ASK signal further comprises a required power information as information requiring generation of wireless power based on a magnetic induction scheme by the wireless power transmitting apparatus.

8. A method of detecting a foreign object using at least one processor included in a wireless power receiving apparatus, the method comprising:
    performing a first operation of foreign object detection prior to an initial charging; and
    performing a second operation of foreign object detection by a temperature sensor if the foreign object is not detected by the first operation of foreign object detection prior to the initial charging, wherein the first operation of foreign object detection prior to the initial charging comprises:

receiving a power signal at an operating point from a wireless power transmitting apparatus which performs digital ping in a ping phase;

generating a signal strength packet indicating strength of the power signal at the operating point and transmitting the signal strength packet to the wireless power transmitting apparatus;

generating an identification packet indicating a unique ID of the wireless power receiving apparatus and configuration information of the wireless power receiving apparatus and transmitting the identification packet and the configuration information to the wireless power transmitting apparatus;

measuring a received power and setting an initial voltage;

checking whether the wireless power receiving apparatus is charging;

comparing a required power value with the received power, generating a power control packet based on the comparison result, and transmitting the generated power control packet to the wireless power transmitting apparatus, if the wireless power receiving apparatus is charging;

checking whether the initial voltage is in a hold state and a steady state value of the initial voltage is within a predetermined reference voltage range, if the wireless power receiving apparatus is not charging; and generating a foreign object state packet, and transmitting the foreign object state packet to the wireless power transmitting apparatus, if the initial voltage is in a hold state and the steady state value of the initial voltage is within the predetermined reference voltage range.

9. A wireless power receiving apparatus comprising:
a secondary core block;
a rectifying unit connected to the secondary core block;
a control unit; and
a temperature sensor,
wherein the rectifying unit performs full-wave rectification on an alternating current (AC) waveform generated by the secondary core block and provides power to the control unit and an external load,
wherein the control unit measures an initial voltage of an output terminal connected to the external load, and performs a first operation of foreign object detection if the initial voltage is within a reference voltage range, and
wherein if a foreign object is not detected before charging starts by the first operation of foreign object detection, the control unit performs a second operation of foreign object detection during charging, and if the foreign object is not detected during the second operation of foreign object detection during charging, the control unit performs a third operation of foreign object detection by the temperature sensor,
wherein the control unit performs the second operation of foreign object detection during charging by controlling the wireless power receiving apparatus to receive a transmission power measurement report indicating a measured transmission power from a wireless power transmitting apparatus, to detect the foreign object based on a difference value between the measured transmission power and a measured reception power, and to transmit an amplitude shift keying (ASK) signal comprising the foreign object detection result to the wireless power transmitting apparatus.

10. The wireless power receiving apparatus of claim 9, wherein the transmission power measurement report is transmitted as a frequency shift keying (FSK) signal, and the measured transmission power is obtained by measuring power generated by a primary coil of the wireless power transmitting apparatus.

11. The wireless power receiving apparatus of claim 10, wherein the FSK signal is transmitted at least once during each predetermined period, the predetermined period being an interval during which a predetermined number of data signals are transmitted.

12. The wireless power receiving apparatus of claim 10, wherein the FSK signal indicates 0 or 1 by switching or selecting a variable frequency of a predetermined range which converts a required fixed power frequency.

13. The wireless power receiving apparatus of claim 9, wherein the ASK signal further comprises a required power information as information requiring generation of wireless power based on a magnetic induction scheme by the wireless power transmitting apparatus.

* * * * *